US010546074B2

(12) United States Patent
He et al.

(10) Patent No.: US 10,546,074 B2
(45) Date of Patent: Jan. 28, 2020

(54) METHOD AND SYSTEM FOR OBTAINING RELATION BETWEEN WINDING STATE AND LEAKAGE REACTANCE PARAMETER OF TRANSFORMER

(71) Applicants: STATE GRID CORPORATION OF CHINA (SGCC), Beijing (CN); Electric Power Research Institute of State Grid Zhejiang Electric Power Company, Zhejiang (CN)

(72) Inventors: Wenlin He, Zhejiang (CN); Xiang Sun, Zhejiang (CN); Haojun Liu, Zhejiang (CN); Wei Qiu, Zhejiang (CN); Hui Yao, Zhejiang (CN); Xuesong Dong, Zhejiang (CN); Jianyang Dong, Zhejiang (CN); Bingxiao Mei, Zhejiang (CN); Wenhao Wang, Zhejiang (CN); Chen Li, Zhejiang (CN); Weiguo Wang, Zhejiang (CN)

(73) Assignees: State Grid Corporation of China (SGCC), Beijing (CN); Electric Power Research Institute of State Grid Zhejiang Electric Power Company, Zhejiang (CN)

( * ) Notice: Subject to any disclaimer, the term of this patent is extended or adjusted under 35 U.S.C. 154(b) by 0 days.

(21) Appl. No.: 14/901,759

(22) PCT Filed: May 14, 2015

(86) PCT No.: PCT/CN2015/078930
§ 371 (c)(1),
(2) Date: Dec. 29, 2015

(87) PCT Pub. No.: WO2016/078364
PCT Pub. Date: May 26, 2016

(65) Prior Publication Data
US 2016/0306904 A1  Oct. 20, 2016

(30) Foreign Application Priority Data
Nov. 17, 2014  (CN) .......................... 2014 1 0654094

(51) Int. Cl.
G06F 17/50 (2006.01)
H01F 29/02 (2006.01)
H02K 19/14 (2006.01)
H03F 1/34 (2006.01)

(52) U.S. Cl.
CPC ...... *G06F 17/5009* (2013.01); *G06F 17/5036* (2013.01); *H01F 29/025* (2013.01); *H02K 19/14* (2013.01); *H03F 1/34* (2013.01)

(58) Field of Classification Search
None
See application file for complete search history.

(56) References Cited

U.S. PATENT DOCUMENTS

| 5,650,748 A * | 7/1997 | Johnston | ................. H03F 1/347 327/190 |
| 5,781,764 A * | 7/1998 | Degeneff | ............ G06F 17/5036 703/2 |
| 2010/0301982 A1* | 12/2010 | Bordin | .................... H01F 30/04 336/170 |

FOREIGN PATENT DOCUMENTS

| CN | 101122929 A | 2/2008 |
| CN | 102207985 A | 10/2011 |

(Continued)

OTHER PUBLICATIONS

K. R. Hameed, "Finite Element Calculation of Leakage Reactance in Distribution Transformer Wound Core Type Using Energy Method" pp. 297-320, 2012.*

(Continued)

*Primary Examiner* — Kibrom K Gebresilassie
(74) *Attorney, Agent, or Firm* — Faegre Baker Daniels LLP

(57) ABSTRACT

A method for obtaining a relation between a winding state and a leakage reactance parameter of a transformer by using (Continued)

simulation software is provided. The method includes: establishing a simulation transformer based on a size of a physical transformer; setting parameters of the simulation transformer; setting a winding of the simulation transformer in a predetermined winding state; obtaining a predetermined number of values of a leakage reactance parameter of the simulation transformer in the winding state; and performing statistics on all the values to obtain a value range of the leakage reactance parameter in a case that the winding is in the winding state. The value range is used as a value range of a leakage reactance parameter of the physical transformer in a case that a winding of the physical transformer is in the winding state.

14 Claims, 9 Drawing Sheets

(56) References Cited

FOREIGN PATENT DOCUMENTS

| | | |
|---|---|---|
| CN | 102611125 A | 7/2012 |
| CN | 103454526 A | 12/2013 |
| CN | 104361173 A | 2/2015 |
| JP | 2001291626 A | 10/2001 |

OTHER PUBLICATIONS

X. Margueron, J. P. Keradec, and D. Magot, "Analytical Calculation of Static Leakage Inductance of HF Transformers Using PEEC Formulas" pp. 884-892, 2007 IEEE.*

Hameed et al, "Finite Element Calculation of Leakage Reactance in Distribution Transformer Wound Core Type Using Energy Method", pp. 297-320, 2012 (Year: 2012).*

International Search Report and Written Opinion (in Chinese language), issued by the State Intellectual Propery Office, the People's Republic of China, dated Jul. 28, 2015, for International Application No. PCT/CN2015/078930; 12 pages.

Written Opinion (English translation) of the International Searching Authority, issued by the State Intellectual Propery Office, the People's Republic of China, dated Jul. 28, 2015, for related International Application No. PCT/CN2015/078930; 4 pages.

First Office Action (with English translation), Application No. 201410654094.4, State Intellectual Property Office of People's Republic of China, dated Feb. 22, 2017, 23 pages.

*Diagnosing Shorted Turns on the Windings of Power Transformers Based Upon Online FRA Using Capacitive and Inductive Couplings*, Vahid Vehjat et al., IEEE Transactions on Power Delivery, vol. 26, No. 4, Oct. 2011, 12 pages.

*Identification Research of Transformer Winding Deformation Based on the Finite Element Theory* (with English abstract), Yuan Jiaxin et al., China Academic Journal Electronic Publishing House, http://www.cnki.net, Oct. 31, 2013, 4 pages.

*Study on Leakage Inductance Calculation Based on Finite Element Method for Power Transformer and Its Application to Winding Deformation Analysis* (with English abstract), Li Peng et al., http://www.doc88.com/p-197579221536.html, Mar. 31, 2010, 6 pages.

*Leakage Inductance Calculation Based on Finite Element Method for Power Transformer and Its Application to Winding Deformation Analysis* (with English abstract on last page), Li Peng et al., China Academic Journal Electronic Publishing House, http://www.cnki.net, Jul. 31, 2007 5 pages.

* cited by examiner

METHOD AND SYSTEM FOR OBTAINING RELATION BETWEEN WINDING STATE AND LEAKAGE REACTANCE PARAMETER OF TRANSFORMER

CROSS REFERENCE OF RELATED APPLICATION

The present application claims the priority to Chinese Patent Application No. 201410654094.4, titled "METHOD AND SYSTEM FOR OBTAINING RELATION BETWEEN WINDING STATE AND LEAKAGE REACTANCE PARAMETER OF TRANSFORMER", filed with the Chinese State Intellectual Property Office on Nov. 17, 2014, the entire disclosure of which is incorporated herein by reference.

FIELD

The disclosure relates to the field of motor software simulation technology, and in particular to a method and a system for obtaining a relation between a winding state and a leakage reactance parameter of a transformer.

BACKGROUND

As a constituent part of transmission and distribution power in a power system, security and stability of a transformer are important for the development of national economy. At present, with constantly upgrading of a voltage class, breakdown of the power system caused by transformer accidents becomes more frequent, which is not only inimical to the rapid development of economy, but has a serious influence on residents' normal life. According to statistics, accidents caused by winding deformation of the transformer account for a highest proportion, up to 71.1% of a total number of the accidents.

A short-circuit impedance method is a main method for detecting a fault of windings in the transformer in an existing power system, however, the method can only detect severity of the fault, and can not effectively determine a type of the fault of the windings, which has a negative impact on knowing deformation inside the windings for field staff, and is inimical to next detection work. Hence, in order to determine whether the windings of the transformer are in a normal state or a fault state in which certain winding deformation occurs, it is required to measure leakage reactance parameter values of a large number of transformers with windings in a normal state or suffering a certain deformation. And a relation between the winding state and the leakage reactance parameter of a transformer is obtained by a large number of data, that is, it is known that a value range of the leakage reactance parameter of the transformer in a case that the windings of the transformer are in the normal state or a value range of the leakage reactance parameter of the transformer in a case that a certain winding deformation occurs in the windings of the transformer. In contrast, a leakage reactance parameter of the transformer is measured, and then a value range of the leakage reactance parameter is determined, thus the winding state of the measured transformer is determined.

However, in order to obtain the relation between the winding state and the leakage reactance parameter of the transformer, a large number of transformers are required, which includes transformers suffering winding deformation. In a case that physical transformers are used to research the relation between the state of the winding and the leakage reactance parameter, a large number of physical transformers will be damaged, which results in a great waste.

SUMMARY

In view of this, a method and a system for obtaining a relation between a winding state and a leakage reactance parameter of a transformer are provided according to the embodiments of the present disclosure, to solve the problem of a great waste in a conventional art caused by using physical transformers to obtain the relation between the winding state and the leakage reactance parameter of the transformer.

In order to achieve the object described above, a technical solution as follows is provided according to an embodiment of the present disclosure.

A method for obtaining a relation between a winding state and a leakage reactance parameter for a transformer by using simulation software is provided, the method includes:

establishing a simulation transformer based on a size of a physical transformer;

setting parameters of the simulation transformer, and setting a winding of the simulation transformer in a predetermined winding state;

obtaining a predetermined number of values of a leakage reactance parameters of the simulation transformers that is in the winding state; and performing statistics on all the predetermined number of values of the leakage reactance parameter of all simulation transformers in the winding state, to obtain a value range of the leakage reactance parameter of the simulation transformer in a case that the winding of the simulation transformer is in the winding state, where the value range is used as a value range of a leakage reactance parameter of the physical transformer in a case that a winding of the physical transformer is in the winding state.

Establishing the simulation transformer based on the size of the physical transformer in a predetermined proportion includes:

establishing an iron core of the simulation transformer by setting center point coordinates of the iron core of the simulation transformer;

establishing a high voltage winding of the simulation transformer, which includes setting a first kind of center point coordinates, a diameter and a cross-sectional shape for each of high voltage single-turn coils of the high voltage winding of the simulation transformer;

establishing a low voltage winding of the simulation transformer by setting a second kind of center point coordinates, a diameter and a cross-sectional shape for each of low voltage single-turn coils of the low voltage winding of the simulation transformer; and establishing an oil tank of the simulation transformer and oil of the simulation transformer.

Setting the parameters of the simulation transformer includes:

setting a magnetization curve of the iron core of the simulation transformer;

setting a magnitude and a direction of a first current density of the high voltage winding of the simulation transformer;

setting a magnitude and a direction of a second current density of the low voltage winding of the simulation transformer, where the direction of the second current density is opposite to the direction of the first current density;

setting a critical condition of the oil tank of the simulation transformer, which includes setting magnetic vectors in Z direction with respect to six faces of the oil tank of the simulation transformer to be zero; and setting a parameter of the oil of the simulation transformer.

Setting the magnitude and the direction of the first current density of the high voltage winding of the simulation transformer includes: setting the magnitude of the first current density of the high voltage winding of the simulation transformer based on a current magnitude of a high voltage winding indicated by a nameplate of the physical transformer; and setting the direction of the first current density of the high voltage winding of the simulation transformer to be a counterclockwise direction; and setting the magnitude and the direction of the second current density of the low voltage winding of the simulation transformer includes: setting the magnitude of the second current density of the high voltage winding of the simulation transformer based on the magnitude of the first current density and a ratio of the number of high voltage windings to the number of low voltage windings indicated by the nameplate of the physical transformer; and setting the direction of the second current density on the high voltage winding of the simulation transformer to be a clockwise direction.

The setting the winding of the simulation transformer in the predetermined winding state includes:

setting y-coordinates of all the first kind of center point coordinates to be the same;

setting y-coordinates of all the second kind of center point coordinates to be the same;

setting x-coordinates of all the first kind of center point coordinate, x-coordinates of all the second kind of center point coordinates and x-coordinate of the center point coordinates of the iron core of the simulation transformer to be the same;

setting the center point coordinates of the iron core of the simulation transformer to remain unchanged;

setting the diameters and the cross-sectional shapes of all the high voltage single-turn coils to be the same; and setting the diameters and the cross-sectional shapes of all the low voltage single-turn coils to be the same, to place the windings of the simulation transformer in a normal state;

keeping the windings of the simulation transformer in the normal state to:

change the y-coordinates of all or a part of the first kind of center point coordinates and/or the second kind of center point coordinates, to place the windings of the simulation transformer in a longitudinal movement fault state;

change the x-coordinate of the center point coordinates of the iron core of the simulation transformer or change the x-coordinates of all or a part of the first kind of center point coordinates and/or the second kind of center point coordinates, to place the windings of the simulation transformer in an axial movement fault state;

change constantly the x-coordinate and/or the y-coordinate of the center point coordinates of the iron core of the simulation transformer, to place the windings of the simulation transformer in a fault state in which the iron core of the windings looses;

increase the diameters of all or a part of the high voltage single-turn coils and/or the low voltage single-turn coils, to place the windings of the simulation transformer in a fault state in which the windings bulge; and bend cross sections of all or a part of the high voltage single-turn coils and/or the low voltage single-turn coils, to place the windings of the simulation transformer in a fault state in which the windings warp.

Obtaining the predetermined number of values of the leakage reactance parameter of the simulation transformers that is in the winding state includes:

obtaining a value W of a magnetic energy parameter of the simulation transformer;

calculating a value L of a leakage inductance parameter of the simulation transformer based on the value W of the magnetic energy parameter; and calculating a value $X_L$ of the leakage reactance parameter of the simulation transformer based on the value L of the leakage inductance parameter;

wherein a calculating formula for calculating the value L of the leakage inductance parameter of the simulation transformer based on the value W of the magnetic energy parameter is:

$$L = \frac{2 \times W}{I_g^2},$$

wherein $I_g$ is a magnitude of a first current density; and wherein a calculating formula for calculating the value $X_L$ of the leakage reactance parameter of the simulation transformer based on the value L of the leakage inductance parameter is:

$$X_L = 2 \times \pi \times f \times L,$$

wherein $\pi$ is 3.14, and f is 50 Hz.

A system for obtaining a relation between a winding state and a leakage reactance parameter for a transformer, based on the method for obtaining the relation between the winding state and the leakage reactance parameter of a transformer, the system includes: a model establishing module, a setting module, a value calculating module and a statistics module, where the model establishing module is configured to establish a simulation transformer based on a size of a physical transformer;

the setting module is configured to set parameters of the simulation transformer, and set a winding of the simulation transformer in a predetermined state;

the value calculating module is configured to obtain a predetermined number of values of a leakage reactance parameter of the simulation transformer that is in the winding state; and the statistics module is configured to perform statistics on all the predetermined number of values of the leakage reactance parameter of the simulation transformer in the winding state, to obtain a value range of the leakage reactance parameter of the simulation transformer in a case that the winding of the simulation transformer is in the winding state, wherein the value range is used as a value range of a leakage reactance parameter of the physical transformer in a case that a winding of the physical transformer is in the winding state.

The model establishing module includes: an iron core establishing unit, a high voltage winding establishing unit, a low voltage winding establishing unit, an oil tank establishing unit and an oil establishing unit, where the iron core establishing unit is configured to establish an iron core of the simulation transformer by setting center point coordinates of the iron core of the simulation transformer;

the high voltage winding establishing unit is configured to establish a high voltage winding of the simulation transformer by setting a first kind of center point coordinates, a diameter and a cross-sectional shape for each of high voltage single-turn coils of the high voltage winding of the simulation transformer;

the low voltage winding establishing unit is configured to establish a low voltage winding of the simulation transformer by setting a second kind of center point coordinates, a diameter and a cross-sectional shape for each of low voltage single-turn coils of the low voltage winding of the simulation transformer;

the oil tank establishing unit is configured to establish an oil tank of the simulation transformer; and the oil establishing unit is configured to establish oil of the simulation transformer.

The setting module includes:

an iron core parameter setting unit, a high voltage winding parameter setting unit, a low voltage winding parameter setting unit, an oil tank parameter setting unit and an oil parameter setting unit, where the iron core setting unit is configured to set a magnetization curve of the iron core of the simulation transformer;

the high voltage winding setting unit is configured to set a magnitude and a direction of a first current density of the high voltage winding of the simulation transformer;

the low voltage winding setting unit is configured to set a magnitude and a direction of a second current density of the low voltage winding of the simulation transformer, where the direction of the second current density is opposite to the direction of the first current density;

the oil tank setting unit is configured to set a critical condition of the oil tank of the simulation transformer by setting magnetic vectors in Z direction with respect to six faces of the oil tank of the simulation transformer to be zero; and the oil setting unit is configured to set a parameter of the oil of the simulation transformer.

The value calculating module includes:

a magnetic energy parameter obtaining unit, a leakage inductance parameter calculating unit and a leakage reactance parameter calculating unit, where the magnetic energy parameter obtaining unit is configured to obtain a value W of a magnetic energy parameter of the transformer;

the leakage inductance parameter calculating unit is configured to calculate a value L of a leakage inductance parameter of the transformer based on the value W of the magnetic energy parameter, where a calculating formula is:

$$L = \frac{2 \times W}{I_g^2},$$

wherein $I_g$ is a magnitude of a first current density; and the leakage reactance parameter calculating unit is configured to calculate a value $X_L$ of the leakage reactance parameter of the transformer based on the value L of the leakage inductance parameter, wherein a calculating formula is: $X_L = 2 \times \pi \times f \times L$, wherein $\pi$ is 3.14, and f is 50 Hz.

Based on the technical solution described above, in the method for obtaining the relation between the winding state and the leakage reactance parameter of a transformer according to the embodiments of the present disclosure, a reason to select to obtain the relation between the winding state and the leakage reactance parameter of the transformer is that there is a significant change in the leakage reactance parameter of the transformer in a case that a certain deformation fault occurs in the windings of the transformer, and it is fast to extract the leakage reactance parameter of the transformer in a case that a certain deformation fault occurs in the windings. In the method for obtaining the relation between the winding state and the leakage reactance parameter of the transformer according to the embodiment of the present disclosure, after the simulation transformer is established by using the simulation software, the winding state of the established simulation transformer is controlled by setting coordinates, a shape of each component of the simulation transformer, and a predetermined number of values of the leakage reactance parameter of the simulation transformer in a certain winding state are obtained. A process of obtaining the values of the leakage reactance parameter of the simulation transformer is equivalent to a process of measuring leakage reactance of the physical transformer. Thus multiple values of the leakage reactance parameter are obtained by changing the coordinates, the shape of each component of the simulation transformer, to replace measuring the leakage reactance parameter by using a large number of the physical transformers. Finally, statistics are performed on the values of the leakage reactance parameter of the simulation transformer in a predetermined winding state by using the simulation software, to obtain the value range of the leakage reactance parameter of the simulation transformer in a case that the windings of the simulation transformer are in the winding state, and therefore, to obtain a value range of the leakage reactance parameter of the physical transformer in a case that the windings of the physical transformer are in the winding state. That is, the relation between the winding state and the leakage reactance parameter of the physical transformer is obtained. The relation between the winding state and the leakage reactance parameter of the transformer is obtained by using the simulation software, which is reasonable and efficient, and compared with that the relation between the winding state and the leakage reactance parameter of the transformer is obtained by using the physical transformers, cost is lower, and a great resource waste is avoided.

BRIEF DESCRIPTION OF THE DRAWINGS

In order to more clearly illustrate the technical solution in the embodiments of the present disclosure or in the conventional art, in the following, drawings required in the description of the embodiments or the conventional art will be introduced simply. Obviously, the drawings in the following description are just some embodiments of the present disclosure. For those skilled in the art, other drawings can also be obtained according to these drawings without any creative work.

DETAILED DESCRIPTION OF THE EMBODIMENTS

Technical solutions according to embodiments of the present disclosure are described clearly and completely in conjunction with the drawings in the embodiments of the present disclosure hereinafter. Apparently, the described embodiments are only a part of rather than all of the embodiments of the present disclosure. All other embodiments obtained by those skilled in the art without any creative work based on the embodiments of the present disclosure fall within the scope of protection of the present disclosure.

Figure 1:
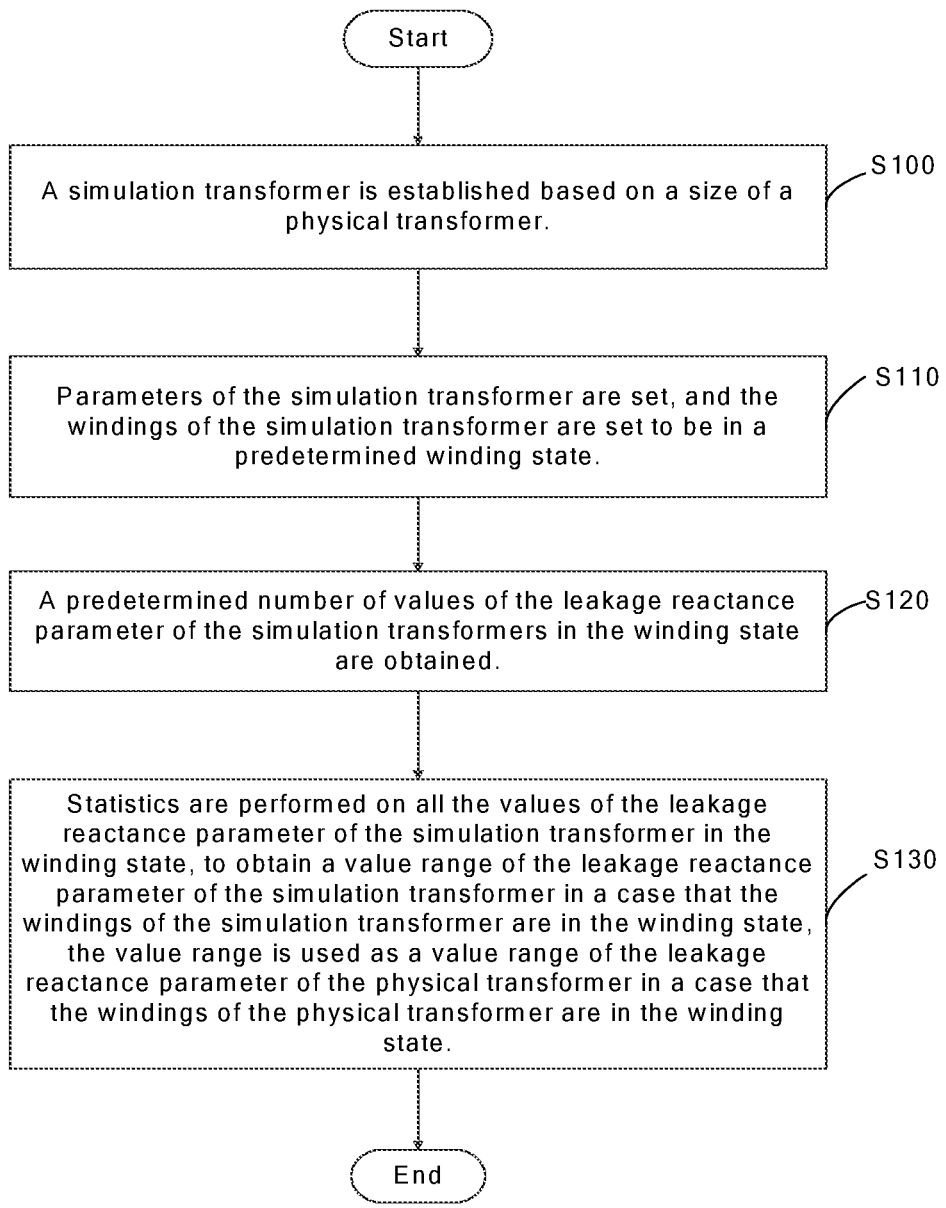
FIG. 1 is a flowchart of a method for obtaining a relation between the winding state and the leakage reactance parameter of a transformer according to an embodiment of the present disclosure.

FIG. 1 is a flowchart of a method for obtaining a relation between a winding state and a leakage reactance parameter of a transformer according to an embodiment of the present disclosure. In the method, the relation between the winding state and the leakage reactance parameter of the transformer is obtained via simulation software, therefore, the usage cost is low, and the problem of a great waste in the conventional art caused by using physical transformers to obtain the relation between the winding state and the leakage reactance parameter of the transformer is solved. Referring to FIG. 1, the method may include the following steps.

In step S100, a simulation transformer is established based on a size of a physical transformer.

Specifically, the value of the leakage reactance parameter of a transformer depends on the structure of the windings of the transformer in a case that an operating frequency is fixed. For a transformer, the value of the leakage reactance parameter will be changed in a case that a fault such as deformation or displacement occurs in the windings of the transformer. Hence, when a simulation transformer is established via simulation software, the size of the simulation transformer should be set based on the size of the physical transformer to be simulated. In other words, the size of the simulation transformer should be identical to the size of the physical transformer to be simulated, to ensure that the relation between the winding state and the leakage reactance parameter of the simulation transformer which is established via the simulation software may be used as the relation between the winding state and the leakage reactance parameter of the physical transformer to be simulated.

Optionally, the established simulation transformer may include an iron core, a high voltage winding, a low voltage winding, an oil tank and oil. The high voltage winding of the simulation transformer includes multiple high voltage single-turn coils, the low voltage winding of the simulation transformer includes multiple low voltage single-turn coils, and the direction of the current density of the high voltage winding of the simulation transformer is opposite to the direction of the current density of the low voltage winding of the simulation transformer.

In a process of establishing the simulation transformer, in addition to setting the size and shape of each component of the simulation transformer based on the size and shape of the physical transformer to be simulated (for example, setting the diameter and the cross-sectional shape of each of the high voltage single-turn coils of the high voltage winding of the simulation transformer and setting the diameter and the cross-sectional shape of each of the low voltage single-turn coils of the low voltage winding of the simulation transformer), the process further includes setting center point coordinates of each component of the simulation transformer such as center point coordinates of the iron core of the simulation transformer, center point coordinates of each of the high voltage single-turn coils of the high voltage winding of the simulation transformer and center point coordinates of each of the low voltage single-turn coils of the low voltage winding of the simulation transformer, to determine the position of each component of the simulation transformer. The center point coordinates of all the high voltage single-turn coils may be referred to as a first kind of center point coordinates, and the center point coordinates of all the low voltage single-turn coils may be referred to as a second kind of center point coordinates.

In step S110, parameters of the simulation transformer are set, and the windings of the simulation transformer are set to be in a predetermined winding state.

Optionally, setting the parameters of the simulation transformer may include: setting a magnetization curve of the iron core of the simulation transformer; setting the magnitude and direction of a first current density of the high voltage winding of the simulation transformer; setting the magnitude and direction of a second current density of the low voltage winding of the simulation transformer; setting a critical condition of the oil tank of the simulation transformer; and setting a parameter of the oil of the simulation transformer. The simulation transformer can be ensured to operate normally by setting the parameters of the simulation transformer.

Optionally, the magnetization curve of the iron core of the simulation transformer may be set as a non-linear magnetization curve for determining whether a fault that the iron core looses occurs in the transformer.

Optionally, since the oil tank of the physical transformer is made of a pure metal, and the high voltage winding, the low voltage winding, the iron core and oil of the physical transformer all are located in the oil tank, magnetic vectors in Z direction with respect to six faces of the oil tank of the simulation transformer may be set to be zero.

It should be illustrated that, the direction of the second current density is opposite to the direction of the first current density. Optionally, the direction of the first current density of the high voltage winding of the simulation transformer may be set to be a counterclockwise direction, and the direction of the second current density of the low voltage winding of the simulation transformer may be set to be a clockwise direction. The magnitude of the first current density of the high voltage winding of the simulation transformer is set based on the current magnitude of the high voltage winding indicated by a nameplate of the physical transformer to be simulated, and the magnitude of the second current density of the low voltage winding of the simulation transformer is set based on the magnitude of the first current density and a ratio of the number of high voltage windings to the number of low voltage windings of the transformer indicated by the nameplate of the physical transformer.

Optionally, the state of the windings of the simulation transformer may include a normal state and a fault state. Specifically, as the name suggests, the normal state of the windings of the simulation transformer is a state in which no winding deformation or winding displacement occurs in the simulation transformer. In the normal state, the simulation transformer may operate normally, and correspondingly, the physical transformer may also operate normally in a case that the windings of the physical transformer are in the normal state. In contrast, the fault state of the simulation transformer is a state in which the winding deformation or the winding displacement occurs in the simulation transformer. The fault state of the windings of the simulation transformer may include: a fault state in which longitudinal displacement occurs, a fault state in which an axial displacement occurs, a fault state in which the iron core of the windings looses, a fault state in which the windings bulge and a fault state in which the windings warp.

Optionally, the winding of the simulation transformer being in the normal state or in various fault states can be simulated by changing center point coordinates of an internal component of the simulation transformer or by changing shape or size of the internal component of the simulation transformer.

In step S120, a predetermined number of values of the leakage reactance parameter of the simulation transformers in the winding state are obtained.

Since the values of the leakage reactance parameter of the transformer depends on the structure of the windings of the transformer, there is a significant change in the leakage reactance parameter of the transformer in a case that a certain deformation fault occurs in the windings of the transformer, and it is fast to extract the leakage reactance parameter in a case that a certain deformation fault occurs in the windings of the transformer and it is more convenient and faster to obtain the relation between the winding state and the leakage reactance parameter of the transformer than to obtain a relation between the winding state and other parameters of the transformer, hence, the relation between the winding state and the leakage reactance parameter of the transformer is obtained in the embodiment of the present disclosure.

Optionally, values of the magnetic energy parameter of the simulation transformer is obtained, and then the value of the leakage inductance parameter of the simulation transformer is calculated based on the value of the magnetic energy parameter of the simulation transformer, the value of the leakage reactance parameter of the simulation transformer can be further calculated based on the value of the leakage inductance parameter of the simulation transformer.

In step S130, statistics are performed on all the values of the leakage reactance parameter of the simulation transformer in the winding state, to obtain a value range of the leakage reactance parameter of the simulation transformer in a case that the windings of the simulation transformer are in the winding state, the value range is used as a value range of the leakage reactance parameter of the physical transformer in a case that the windings of the physical transformer are in the winding state.

It should be illustrated that, although the shape and the size of the simulation transformer are set based on the physical transformer, the simulation transformer is different from the physical transformer. Hence, there is still certain difference between the value range of the leakage reactance parameter of the simulation transformer measured in a case that the simulation transformer is in a certain winding state and the value range of leakage reactance parameter of the physical transformer measured in a case that the physical transformer is in the winding state, and it is impossible that the value range of the leakage reactance parameter of the simulation transformer measured in a case that the simulation transformer is in a certain winding state is identical to the value range of leakage reactance parameter of the physical transformer measured in a case that the physical transformer is in the winding state. However, within a permissible range of error, the value range of the leakage reactance parameter of the simulation transformer obtained in a case that the windings of the simulation transformer are in a certain state can be used as the value range of the leakage reactance parameter of the physical transformer in a case that the physical transformer is in the winding state.

Based on the technical solution described above, in the method for obtaining the relation between the winding state and the leakage reactance parameter of the transformer according to the embodiments of the present disclosure, after the simulation transformer is established by using the simulation software, the winding state of the established simulation transformer is controlled by setting coordinates, a shape of each component of the simulation transformer, and a predetermined number of values of the leakage reactance parameter of the simulation transformer in a certain winding state are obtained. A process of obtaining the values of the leakage reactance parameter of the simulation transformer is equivalent to a process of measuring leakage reactance of the physical transformer. Thus multiple values of the leakage reactance parameter are obtained by changing the coordinates, the shape of each component of the simulation transformer, to replace measuring the leakage reactance parameter by using a large number of the physical transformers. Finally, statistics are performed on all the predetermined number of values of the leakage reactance parameter of the simulation transformer in a predetermined winding state by using the simulation software, to obtain the value range of the leakage reactance parameter of the simulation transformer in a case that the windings of the simulation transformer are in the winding state, and therefore, to obtain the value range of the leakage reactance parameter of the physical transformer in a case that the windings of the physical transformer are in the winding state. That is, the relation between the winding state and the leakage reactance parameter of the physical transformer is obtained. The relation between the winding state and the leakage reactance parameter of the transformer is obtained by using the simulation software, which is reasonable and efficient, and compared with that the relation between the winding state and the leakage reactance parameter of the transformer is obtained by using the physical transformers, cost is lower, and a great resource waste is avoided.

Figure 2:
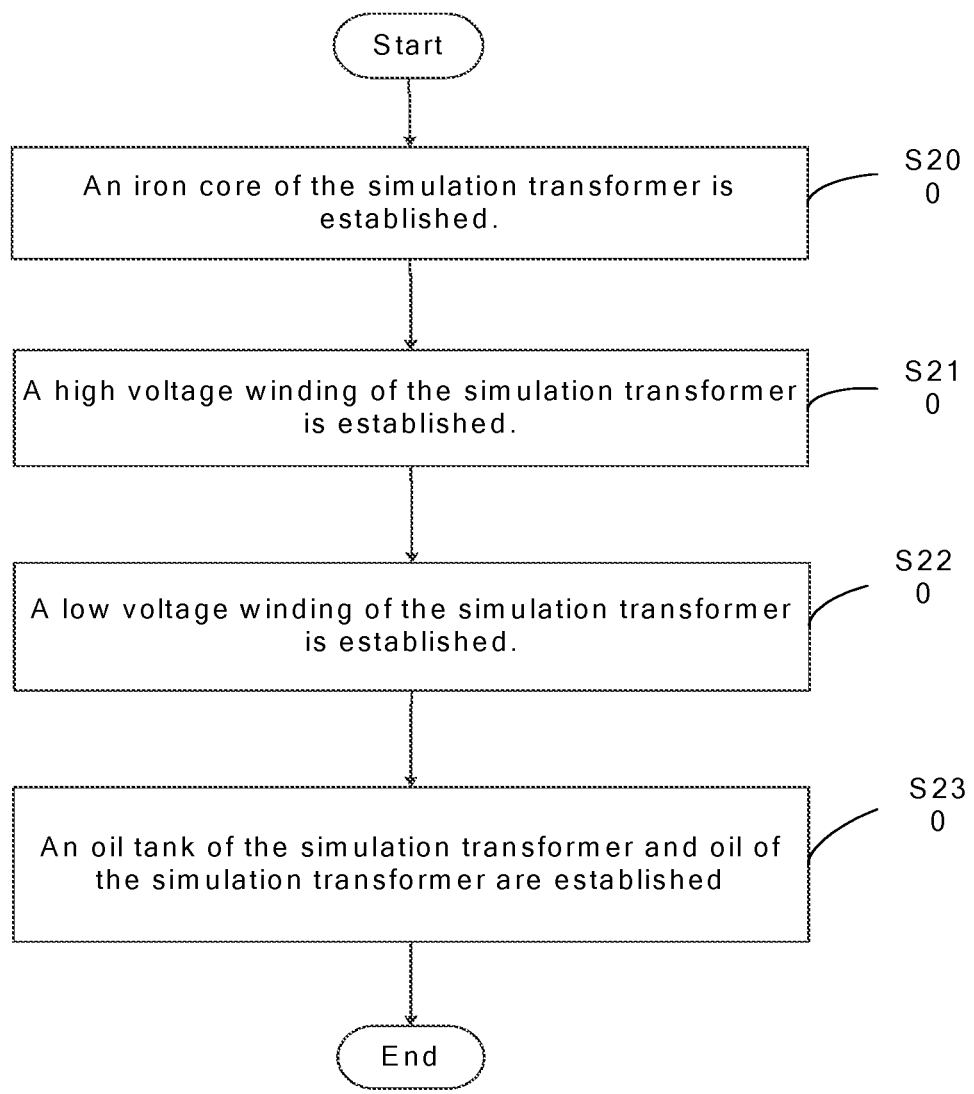
FIG. 2 is a flowchart of a method for establishing a simulation transformer in a method for obtaining a relation between the winding state and the leakage reactance parameter of a transformer according to an embodiment of the present disclosure.

FIG. 2 shows a flowchart of a method for establishing a simulation transformer in a method for obtaining a relation between the winding state and the leakage reactance parameter for a transformer according to an embodiment of the present disclosure. Referring to FIG. 2, establishing the simulation transformer may include the following steps.

In step S200, an iron core of the simulation transformer is established.

Optionally, establishing the iron core of the simulation transformer may include setting shape, size and center point coordinates of the iron core of the simulation transformer. Optionally, the iron core of the simulation transformer may be set to be in a shape of cylinder. It is required to set the radius, the height and the center point coordinates of the iron core of the simulation transformer in a case that the iron core of the simulation transformer is set to be in the shape of cylinder.

Optionally, the center point coordinates of the iron core of the transformer is geometric center point coordinates of the iron core of the transformer.

In step S210, a high voltage winding of the simulation transformer is established.

Optionally, establishing the high voltage winding of the simulation transformer may include setting a first kind of center point coordinates, a diameter and a cross-sectional shape for each of high voltage single-turn coils of the high voltage winding of the simulation transformer.

In step S220, a low voltage winding of the simulation transformer is established.

Optionally, establishing the low voltage winding of the simulation transformer may include setting a second kind of center point coordinates, a diameter and a cross-sectional shape for each of low voltage single-turn coils of the low voltage winding of the simulation transformer.

In step S230, an oil tank of the simulation transformer and oil of the simulation transformer are established.

The oil of the simulation transformer is located inside of the oil tank of the simulation transformer.

Optionally, the oil tank of the simulation transformer may be set to be in a shape of cuboid, and the oil tank of the simulation transformer is filled with the oil of the simulation transformer.

It should be illustrated that, the present disclosure does not intend to limit the order of step S200, step S210, step S220 and step S230, and step S200, step S210, step S220 and step S230 may be executed in any order, and the order of executing step S200, step S210, step S220 and step S230 has no effect on establishing the simulation transformer in the embodiment according to the present disclosure.

Figure 3:
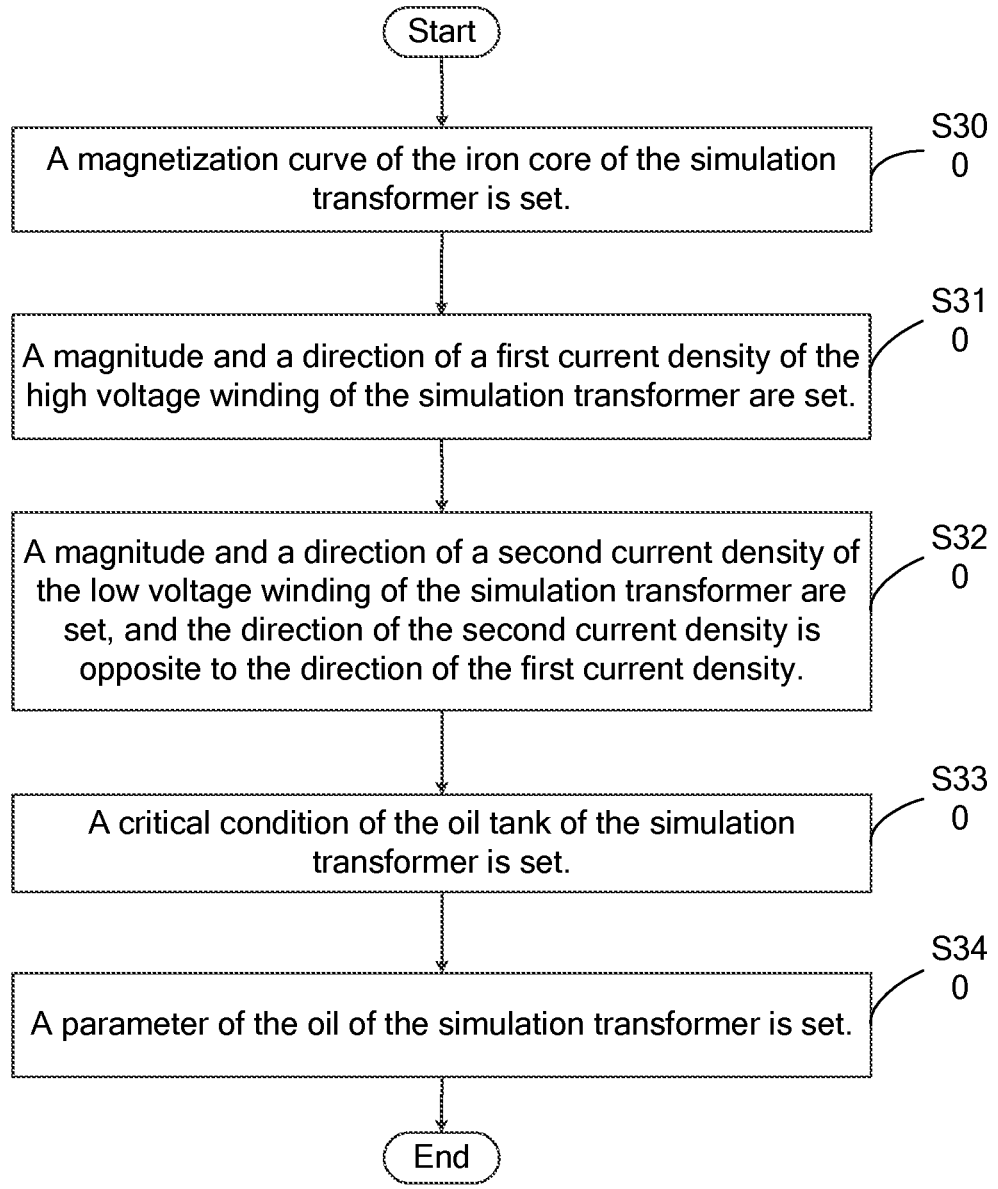
FIG. 3 is a flowchart of a method for setting parameters of a simulation transformer in a method for obtaining a relation between the winding state and the leakage reactance parameter of a transformer according to an embodiment of the present disclosure.

FIG. 3 shows a flowchart of a method for setting parameters of a simulation transformer in a method for obtaining a relation between the winding state and the leakage reactance parameter for a transformer according to an embodiment of the present disclosure. Referring to FIG. 3, setting the parameters of the simulation transformer may include the following steps.

In step S300, a magnetization curve of the iron core of the simulation transformer is set.

Specifically, the magnetization curve of the iron core of the simulation transformer reflects a relation between the magnetic field intensity of the iron core and the induced magnetic induction intensity. It may be determined whether the iron core looses by assigning a nonlinear magnetization curve to the iron core, in a case of a fault that the iron core of the simulation transformer looses.

In step S310, a magnitude and a direction of a first current density of the high voltage winding of the simulation transformer are set.

Optionally, the magnitude of the first current density of the high voltage winding of the simulation transformer is set based on the current magnitude of the high voltage winding indicated by the nameplate of the physical transformer to be simulated.

Optionally, the direction of the first current density of the high voltage winding of the simulation transformer may be set to be a counterclockwise direction.

In step S320, a magnitude and a direction of a second current density of the low voltage winding of the simulation transformer are set, and the direction of the second current density is opposite to the direction of the first current density.

Optionally, the magnitude of the second current density of the low voltage winding of the simulation transformer is set based on the magnitude of the first current density of the high voltage winding of the simulation transformer, and a ratio of the number of high voltage windings to the number of low voltage windings of the transformer indicated by the nameplate of the physical transformer to be simulated.

Optionally, the direction of the second current density of the low voltage winding of the simulation transformer may be set to be a clockwise direction.

In step S330, a critical condition of the oil tank of the simulation transformer is set.

Optionally, magnetic vectors in Z direction with respect to six faces of the oil tank of the simulation transformer may be set to be zero.

In step S340, a parameter of the oil of the simulation transformer is set.

The parameter of the oil of the simulation transformer corresponds to the type of the oil of the transformer. In the process of obtaining the relation between the winding state and the leakage reactance parameter according to the embodiment of the present disclosure, the oil of the transformer used in each set of data should be the same, that is, the parameter of the oil of the simulation transformer should be set to remain unchanged in a process of obtaining each set of data.

The present disclosure does not intend to limit the order of step S300, step S310, step S320, step S330 and step S340, and the five steps may be executed in any order. The parameters of the simulation transformer may be set by executing the five steps.

Figure 4:
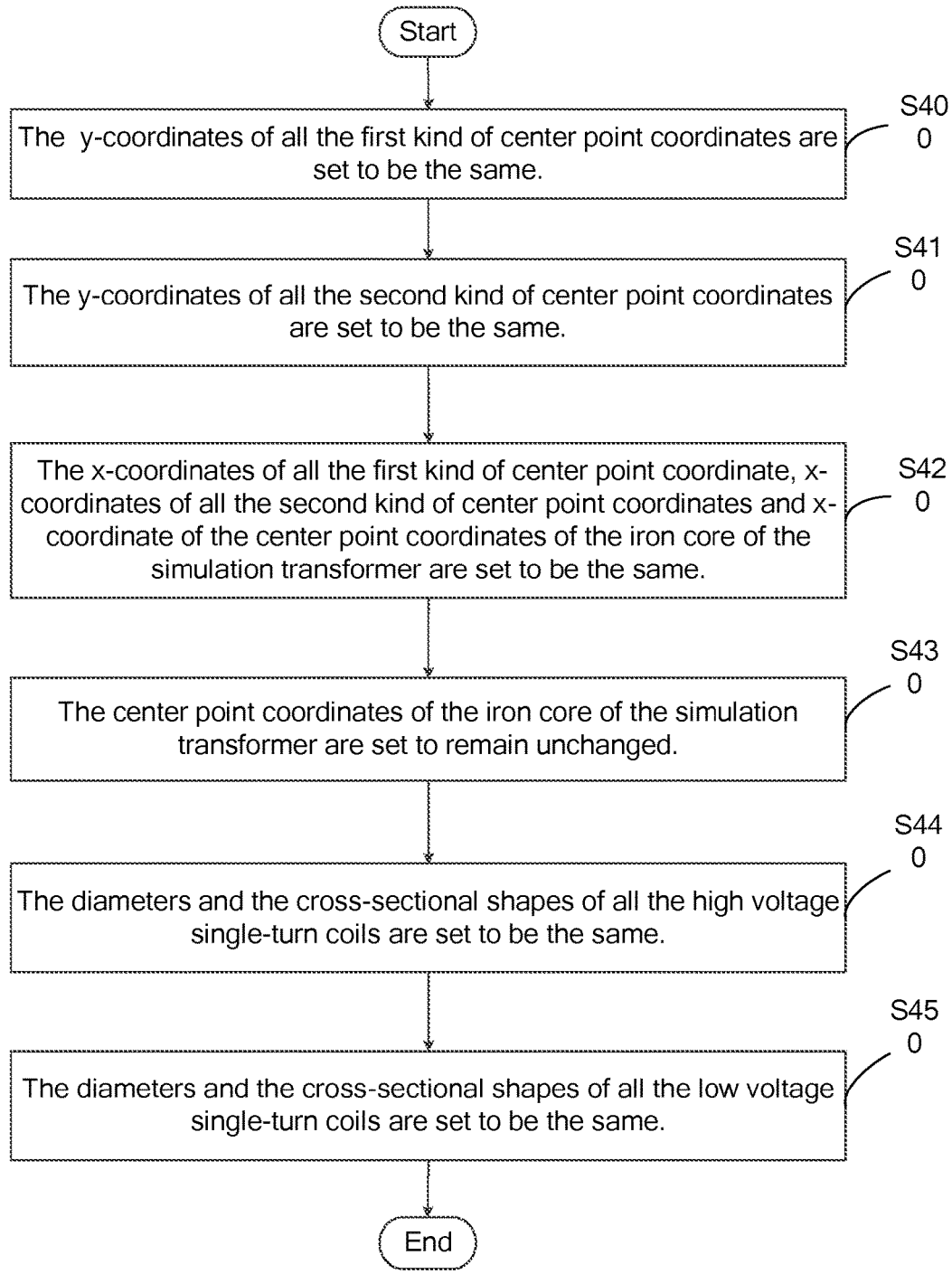
FIG. 4 is a flowchart of a method for setting windings of a simulation transformer to be in a normal state in a method for obtaining a relation between the winding state and the leakage reactance parameter of a transformer according to an embodiment of the present disclosure.

FIG. 4 shows a flowchart of a method for setting the windings of the simulation transformer to be in a normal state in a method for obtaining a relation between the winding state and the leakage reactance parameter of a transformer according to an embodiment of the present disclosure. Referring to FIG. 4, setting the windings of the simulation transformer to be in the normal state may include the following steps.

In step S400, y-coordinates of all the first kind of center point coordinates are set to be the same.

Specifically, the first kind of center point coordinates includes center point coordinates of all the high voltage single-turn coils. No longitudinal displacement fault in the high voltage winding of the simulation transformer can be ensured by setting the y-coordinates of all the first kind of center point coordinates to be the same.

In step S410, y-coordinates of all the second kind of center point coordinates are set to be the same.

The second kind of center point coordinates includes center point coordinates of all the low voltage single-turn coils. No longitudinal displacement fault in the low voltage winding of the simulation transformer can be ensured by setting the y-coordinates of all the second kind of center point coordinates to be the same.

In step S420, x-coordinates of all the first kind of center point coordinate, x-coordinates of all the second kind of center point coordinates and x-coordinate of the center point coordinates of the iron core of the simulation transformer are set to be the same.

No axial displacement fault in the winding of the simulation transformer can be ensured by setting x-coordinates of all the first kind of center point coordinate, x-coordinates of all the second kind of center point coordinates and x-coordinate of the center point coordinates of the iron core of the simulation transformer to be the same.

In step S430, the center point coordinates of the iron core of the simulation transformer are set to remain unchanged.

Specifically, no fault that the iron core of the simulation transformer looses can be ensured by setting the center point coordinates of the iron core of the simulation transformer to remain unchanged.

In step S440, the diameters and the cross-sectional shapes of all the high voltage single-turn coils are set to be the same.

In step S450, the diameters and the cross-sectional shapes of all the low voltage single-turn coils are set to be the same.

No fault that the winding of the simulation transformer bulges can be ensured by setting the diameters of all the high voltage single-turn coils to be the same and the diameters of all the low voltage single-turn coils to be the same. No fault that the winding of the simulation transformer warps can be ensured by setting the cross-sectional shapes of all the high voltage single-turn coils to be the same and the cross-sectional shapes of all the low voltage single-turn coils to be the same.

Similarly, the present disclosure does not intend to limit the order of S400 to S450, and these steps may be executed in any order. The windings of the simulation transformer may be set to be in a normal state by executing these steps.

Figure 5:
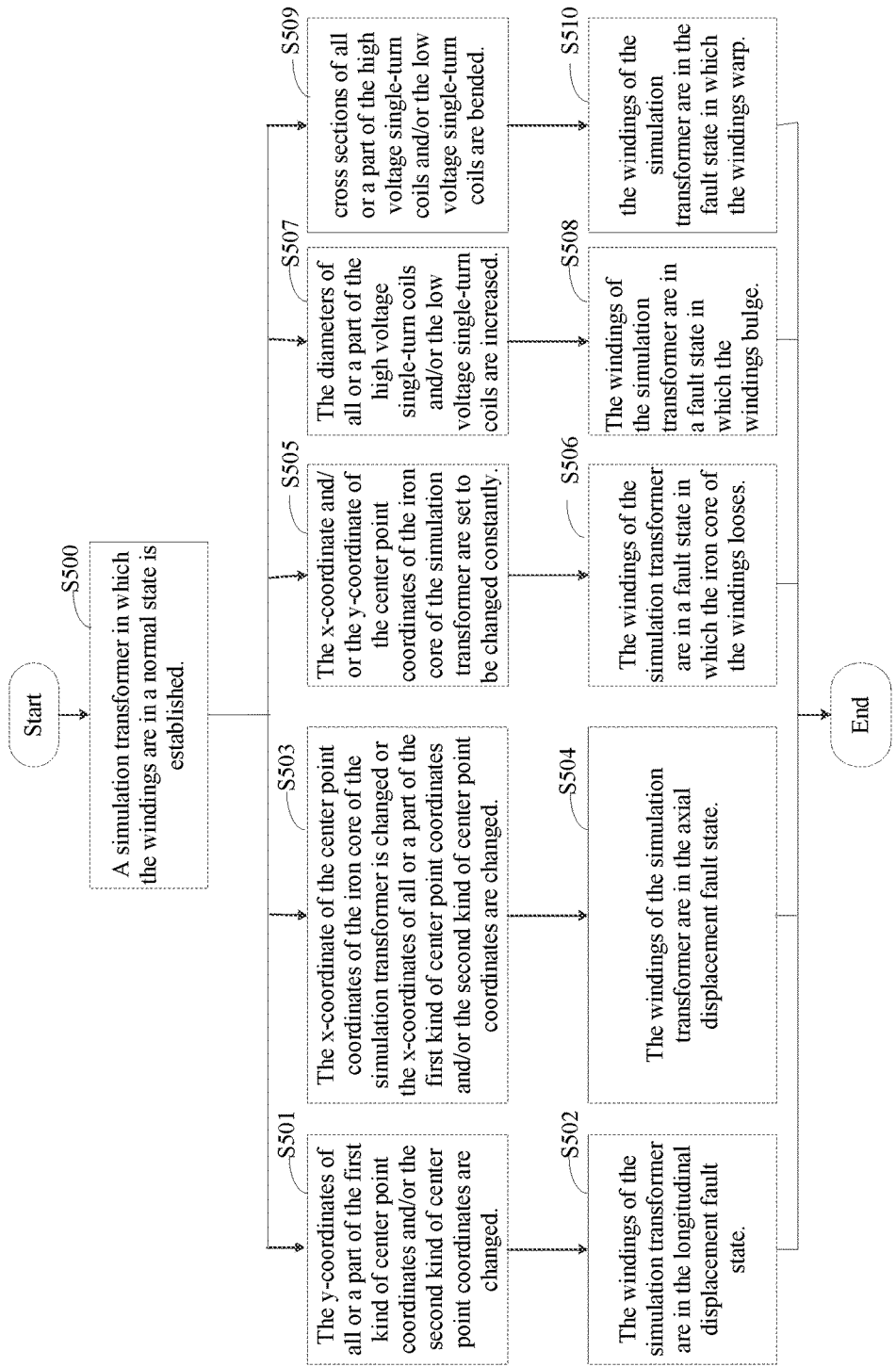
FIG. 5 is a flowchart of a method for setting windings of a simulation transformer to be in a fault state in a method for obtaining a relation between the winding state and the leakage reactance parameter of a transformer according to an embodiment of the present disclosure.

FIG. 5 shows a flowchart of a method for setting the windings of a simulation transformer to be in a fault state in a method for obtaining a relation between the winding state and the leakage reactance parameter of a transformer according to an embodiment of the present disclosure. Referring to FIG. 5, setting the windings of the simulation transformer to be in the fault state may include the following steps.

In step S500, a simulation transformer in which the windings are in a normal state is established.

Specifically, values of the simulation transformer in which the windings are in the normal state are changed, so that the windings of the simulation transformer become in a fault state.

In step S501, the y-coordinates of all or a part of the first kind of center point coordinates and/or the second kind of center point coordinates are changed.

Specifically, the y-coordinates of all or a part of the first kind of center point coordinates are changed, to place the high voltage winding of the simulation transformer in a longitudinal displacement fault state. The more the number of the first kind of center point coordinates whose y-coordinates are changed, the more serious is the longitudinal displacement fault of the high voltage winding of the simulation transformer. The longitudinal displacement fault of the high voltage winding of the simulation transformer is the most serious in a case that the y-coordinates of all the first kind of center point coordinates are changed.

The y-coordinates of all or a part of the second kind of center point coordinates are changed, to place the low voltage winding of the simulation transformer in a longitudinal displacement fault state. The more the number of the second kind of center point coordinates whose y-coordinates are changed, the more serious is the longitudinal displacement fault of the low voltage winding of the simulation transformer. The longitudinal displacement fault of the low voltage winding of the simulation transformer is the most serious in a case that the y-coordinates of all the second kind of center point coordinates are changed.

In step S502, the windings of the simulation transformer are in the longitudinal displacement fault state.

Specifically, the windings of the simulation transformer are regarded to be in the longitudinal displacement fault state in a case that any one or all of the high voltage winding of the simulation transformer and the low voltage winding of the simulation transformer are in the longitudinal displacement fault state.

The longitudinal displacement fault of the windings of the simulation transformer is the most serious in a case that the y-coordinates of all of the first kind of center point coordinates of the high voltage winding of the simulation transformer are changed and the y-coordinates of all of the second kind of center point coordinates of the low voltage winding of the simulation transformer are changed.

In step S503, the x-coordinate of the center point coordinates of the iron core of the simulation transformer is changed or the x-coordinates of all or a part of the first kind of center point coordinates and/or the second kind of center point coordinates are changed.

Specifically, the x-coordinates of all or a part of the first kind of center point coordinates are changed, to place the high voltage winding of the simulation transformer in an axial displacement fault state. The more the number of the first kind of center point coordinates whose x-coordinates are changed, the more serious is the axial displacement fault of the high voltage winding of the simulation transformer. The axial displacement fault of the high voltage winding of the simulation transformer is the most serious in a case that the x-coordinates of all the first kind of center point coordinates are changed.

The x-coordinates of all or a part of the second kind of center point coordinates are changed, to place the low voltage winding of the simulation transformer in an axial displacement fault state. The more the number of the second kind of center point coordinates whose x-coordinates are changed, the more serious is the axial displacement fault of the low voltage winding of the simulation transformer. The axial displacement fault of the low voltage winding of the simulation transformer is the most serious in a case that the x-coordinates of all the second kind of center point coordinates are changed.

Changing the x-coordinate of the center point coordinates of the iron core of the simulation transformer is equivalent to changing the x-coordinates of all of the first kind of center point coordinates of the high voltage winding of the simulation transformer and the x-coordinates of all of the second kind of center point coordinates of the low voltage winding of the simulation transformer by the same amount.

It should be illustrated that, changing the x-coordinate of the center point coordinates of the iron core of the simulation transformer means herein that the x-coordinate of the center point coordinates of the iron core of the simulation transformer is changed once rather than constantly. The x-coordinate of the center point coordinates of the iron core of the simulation transformer is changed, and then the leakage reactance parameter of the simulation transformer is measured. Then the x-coordinate of the center point coordinates of the iron core of the simulation transformer is changed again for next measurement.

In step S504, the windings of the simulation transformer are in the axial displacement fault state.

Specifically, the windings of the simulation transformer are regarded to be in the axial displacement fault state in a case that any one or all of the high voltage winding of the simulation transformer and the low voltage winding of the simulation transformer are in the axial displacement fault state.

The axial displacement fault of the windings of the simulation transformer is the most serious in a case that the x-coordinate of the center point coordinates of the iron core of the simulation transformer is changed, or in a case that the x-coordinates of all the first kind of center point coordinates of the high voltage winding of the simulation transformer are changed and the x-coordinates of all the second kind of center point coordinates of the low voltage winding of the simulation transformer are changed.

In step S505, the x-coordinate and/or the y-coordinate of the center point coordinates of the iron core of the simulation transformer are set to be changed constantly.

Specifically, the center point coordinates of the iron core of the simulation transformer will be changed constantly in the operation process in a case that the iron core in the windings of the transformer looses. A fault that the iron core in the windings of the transformer looses can be simulated by setting the x-coordinate of the center point coordinates of the iron core of the simulation transformer to be changed constantly, or by setting the y-coordinate of the center point coordinates of the iron core of the simulation transformer to be changed constantly, or by setting the x-coordinate and the y-coordinate of the center point coordinates of the iron core of the simulation transformer to be changed constantly.

Optionally, the x-coordinate and/or the y-coordinate of the center point coordinates of the iron core of the simulation transformer may be set to be changed constantly at a predetermined frequency and a predetermined amount, i.e. according to a preset rule. Of course, the x-coordinate and/or the y-coordinate of the center point coordinates of the iron core of the simulation transformer may also be set to be changed constantly in a random way.

In step S506, the windings of the simulation transformer are in a fault state in which the iron core of the windings looses.

Specifically, the windings of the simulation transformer are regarded to be in the fault state in which the iron core in the windings looses in a case that the x-coordinate of the center point coordinates of the iron core of the simulation transformer is changed constantly, the y-coordinate of the center point coordinates of the iron core of the simulation transformer is changed constantly, or the x-coordinate and the y-coordinate of the center point coordinates of the iron core of the simulation transformer both are changed constantly In step S507, the diameters of all or a part of the high voltage single-turn coils and/or the low voltage single-turn coils are increased.

Specifically, the diameters of all or a part of the high voltage single-turn coils are increased, to place the high voltage winding of the simulation transformer in a fault state in which the winding bulges; the more the number of the high voltage single-turn coils whose diameter is increased, the more serious is the fault that the high voltage winding of the simulation transformer bulges; the fault that the high voltage winding of the simulation transformer bulges is the most serious in a case that the diameters of all the high voltage single-turn coils are increased.

Similarly, the diameters of all or a part of the low voltage single-turn coils are increased, to place the low voltage winding of the simulation transformer in a fault state in which the winding bulges; the more the number of the low voltage single-turn coils whose diameter is increased, the more serious is the fault that the low voltage winding of the simulation transformer bulges; the fault that the low voltage winding of the simulation transformer bulges is the most serious in a case that the diameters of all the low voltage single-turn coils are increased.

In step S508, the windings of the simulation transformer are in a fault state in which the windings bulge.

Specifically, the windings of the simulation transformer are regarded to be in the fault state in which the windings bulge in a case that any one or all of the high voltage winding of the simulation transformer and the low voltage winding of the simulation transformer bulge.

The fault that the windings of the simulation transformer bulge is the most serious fault in a case that the diameters of all the high voltage single-turn coils of the high voltage winding of the simulation transformer are increased and the diameters of all the low voltage single-turn coils of the low voltage winding of the simulation transformer are increased.

In step S509, cross sections of all or a part of the high voltage single-turn coils and/or the low voltage single-turn coils are bended.

Specifically, the cross sections of all or a part of the high voltage single-turn coils are bended, to place the high voltage winding of the simulation transformer in the fault state in which the winding warps; the more the number of the high voltage single-turn coils whose cross section are bended, the more serious is the fault that the high voltage winding of the simulation transformer warps is; the fault that the high voltage winding of the simulation transformer warps is the most serious in a case that the cross sections of all the high voltage single-turn coils are bended.

Similarly, the cross sections of all or a part of the low voltage single-turn coils are bended, to place the low voltage winding of the simulation transformer in the fault state in which the winding warps; the more the number of the low voltage single-turn coils whose cross sections are bended, the more serious is the fault that the low voltage winding of the simulation transformer warps; the fault that the low voltage winding of the simulation transformer warps is the most serious in a case that the cross sections of all the low voltage single-turn coils are bended.

In step S510, the windings of the simulation transformer are in the fault state in which the windings warp.

The windings of the simulation transformer are regarded to be in the fault state in which the windings warp in a case that any one or all of the high voltage winding of the simulation transformer and the low voltage of the simulation transformer warp.

The fault that the windings of the simulation transformer warp is the most serious in a case that the cross sections of all the high voltage single-turn coils of the high voltage winding of the simulation transformer are bended and the cross sections of all the low voltage single-turn coils of the low voltage winding of the simulation transformer are bended.

Figure 6:
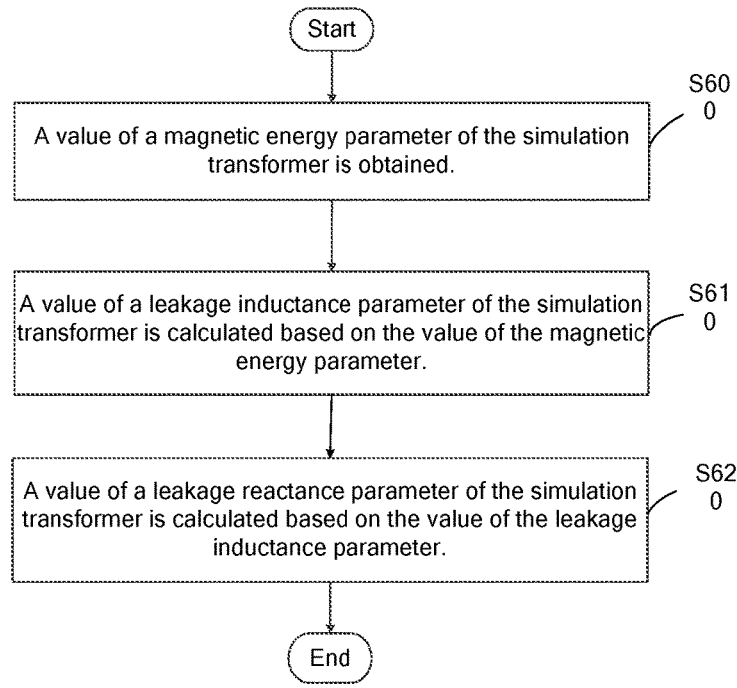
FIG. 6 is a flowchart of a method for obtaining a leakage reactance parameter of a simulation transformer in a method for obtaining a relation between the winding state and the leakage reactance parameter of a transformer according to an embodiment of the present disclosure.

FIG. 6 shows a flowchart of a method for obtaining values of the leakage reactance parameter of a simulation transformer in a method for obtaining a relation between the winding state and the leakage reactance parameter of a transformer according to an embodiment of the present disclosure. Referring to FIG. 6, obtaining the values of the leakage reactance parameter of the simulation transformer may include the following steps.

In step S600, a value of a magnetic energy parameter of the simulation transformer is obtained.

In step S610, a value of a leakage inductance parameter of the simulation transformer is calculated based on the value of the magnetic energy parameter.

Optionally, a calculating formula for calculating the value L of the leakage inductance parameter of the simulation transformer based on the value W of the magnetic energy parameter may be:

$$L = \frac{2 \times W}{I_g^2},$$

where $I_g$ is a magnitude of the first current density.

In step S620, a value of a leakage reactance parameter of the simulation transformer is calculated based on the value of the leakage inductance parameter.

Optionally, a calculating formula for calculating the value $X_L$ of the leakage reactance parameter of the simulation transformer based on the value L of the leakage inductance parameter may be:

$$X_L = 2 \times \pi \times f \times L,$$

where $\pi$ is a circumference ratio, optionally, $\pi$ may be 3.14, and f may be 50 Hz.

In the method for obtaining the relation between the winding state and the leakage reactance parameter of the transformer according to the embodiment of the present disclosure, the relation between the winding state and the leakage reactance parameter of the transformer is obtained by using the simulation software, therefore, the usage cost is low, and the problem of a great waste in the conventional art caused by using physical transformers to obtain the relation between the winding state and the leakage reactance parameter of the transformer is solved.

A system for obtaining a relation between the winding state and the leakage reactance parameter for a transformer according to the embodiment of the present disclosure will be introduced below. The system for obtaining the relation between the winding state and the leakage reactance parameter for the transformer described below may correspondingly refer to the method for obtaining the relation between the winding state and the leakage reactance parameter for the transformer described above.

Figure 7:
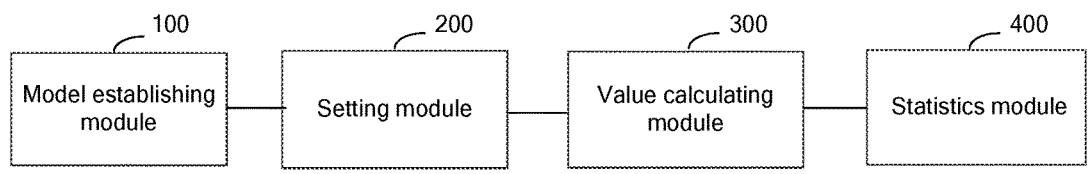
FIG. 7 is a structural block diagram of a system for obtaining a relation between the winding state and the leakage reactance parameter of a transformer according to an embodiment of the present disclosure.

FIG. 7 is a structural block diagram of a system for obtaining a relation between a winding state and a leakage reactance parameter for a transformer according to an embodiment of the present disclosure. Referring to FIG. 7, the system may include: a model establishing module 100, a parameter setting module 200, a value calculating module 300 and a statistics module 400.

Specifically, the model establishing module 100 is configured to establish a simulation transformer based on a size of a physical transformer.

The setting module 200 is configured to set parameters of the simulation transformer, and set windings of the simulation transformer to be in a predetermined state.

The value calculating module 300 is configured to obtain a predetermined number of values of the leakage reactance parameter of the simulation transformers that is in the winding state.

The statistics module 400 is configured to perform statistics on the values of the leakage reactance parameter of all the simulation transformers in the winding state, to obtain a value range of the leakage reactance parameter of the simulation transformer in a case that the windings of the simulation transformer are in the winding state, where the value range is used as a value range of the leakage reactance parameter of the physical transformer in a case that the windings of the physical transformer are in the winding state.

Figure 8:
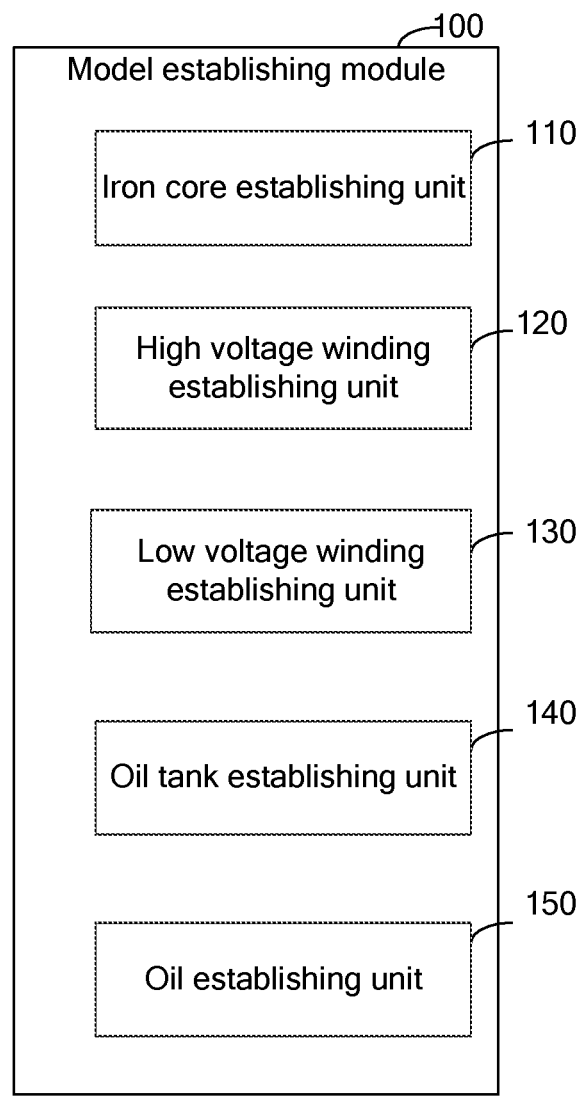
FIG. 8 is a structural block diagram of a model establishing module in a system for obtaining a relation between the winding state and the leakage reactance parameter of a transformer according to an embodiment of the present disclosure.

Optionally, FIG. 8 shows an optional structure of the model establishing module 100 in the system for obtaining the relation between the winding state and the leakage reactance parameter of the transformer according to an embodiment of the present disclosure. Referring to FIG. 8, the model establishing module 100 may include an iron core establishing unit 110, a high voltage winding establishing unit 120, a low voltage winding establishing unit 130, an oil tank establishing unit 140 and an oil establishing unit 150.

Specifically, the iron core establishing unit 110 is configured to establish an iron core of the simulation transformer by setting center point coordinates of the iron core of the simulation transformer.

The high voltage winding establishing unit 120 is configured to establish a high voltage winding of the simulation transformer by setting a first kind of the center point coordinates, a diameter and a cross-sectional shape for each of high voltage single-turn coils of the high voltage winding of the simulation transformer.

The low voltage winding establishing unit 130 is configured to establish a low voltage winding of the simulation transformer by setting a second kind of the center point coordinates, a diameter and a cross-sectional shape for each of low voltage single-turn coils of the low voltage winding of the simulation transformer.

The oil tank establishing unit 140 is configured to establish an oil tank of the simulation transformer.

The oil establishing unit 150 is configured to establish oil of the simulation transformer.

Figure 9:
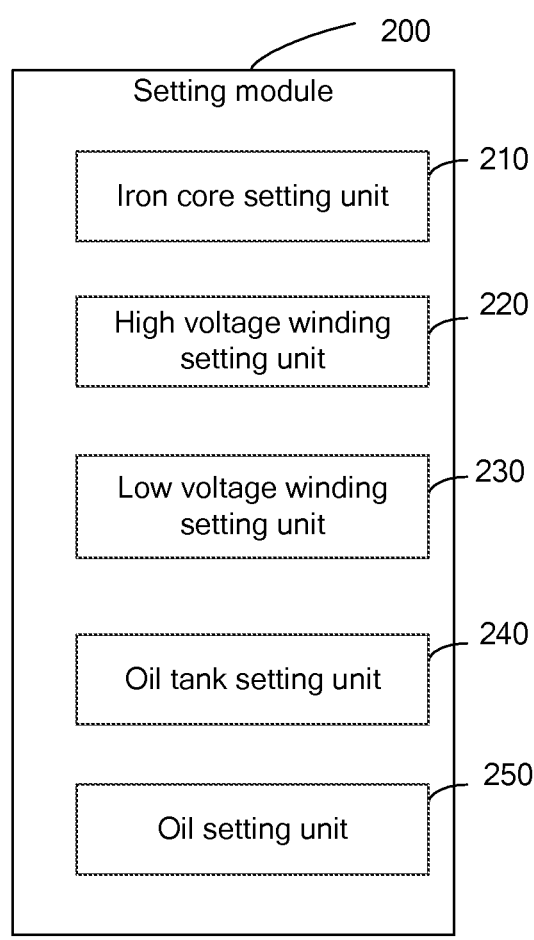
FIG. 9 is a structural block diagram of a setting module in a system for obtaining a relation between the winding state and the leakage reactance parameter of a transformer according to an embodiment of the present disclosure.

Optionally, FIG. 9 shows an optional structure of the setting module 200 in the system for obtaining a relation between the winding state and the leakage reactance parameter of a transformer according to an embodiment of the present disclosure. Referring to FIG. 9, the setting module 200 may include an iron core setting unit 210, a high voltage winding setting unit 220, a low voltage winding setting unit 230, an oil tank setting unit 240 and an oil setting unit 250.

Specifically, the iron core setting unit 210 is configured to set a magnetization curve of the iron core of the simulation transformer;

The high voltage winding parameter setting unit 220 is configured to set the magnitude and the direction of the first current density of the high voltage winding of the simulation transformer.

The low voltage winding parameter setting unit 230 is configured to set the magnitude and the direction of the second current density of the low voltage winding of the simulation transformer, where the direction of the second current density is opposite to the direction of the first current density.

The oil tank setting unit 240 is configured to set a critical condition of the oil tank of the simulation transformer by setting magnetic vectors in Z direction with respect to six faces of the oil tank of the simulation transformer to be zero.

The oil setting unit 250 is configured to set a parameter of the oil of the simulation transformer.

Figure 10:
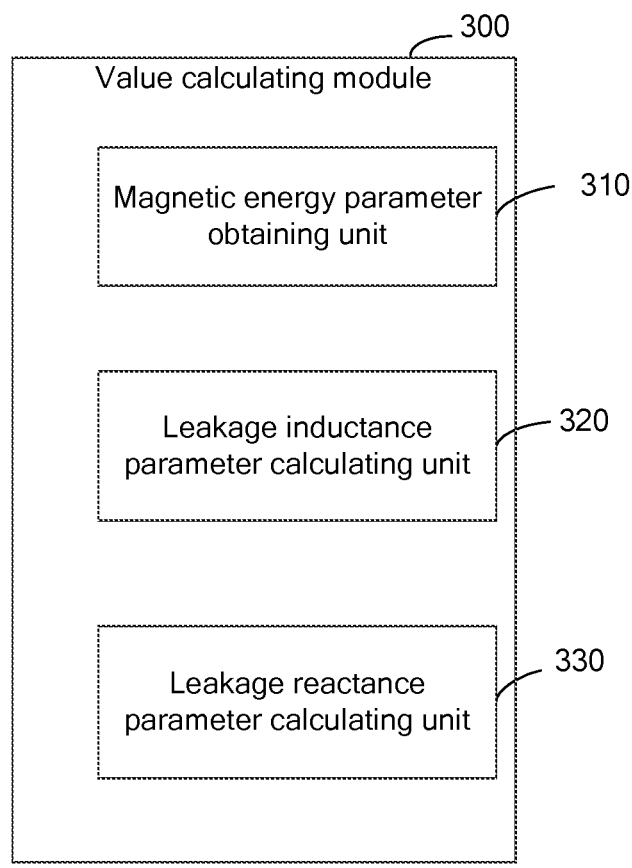
FIG. 10 is a structural block diagram of a value calculating module in a system for obtaining a relation between the winding state and the leakage reactance parameter of a transformer according to an embodiment of the present disclosure.

Optionally, FIG. 10 shows an optional structure of the value calculating module 300 in the system for obtaining a relation between the winding state and the leakage reactance parameter of a transformer according to an embodiment of the present disclosure. Referring to FIG. 10, the value calculating module 300 may include: a magnetic energy parameter obtaining unit 310, a leakage inductance parameter calculating unit 320 and a leakage reactance parameter calculating unit 330.

Specifically, the magnetic energy parameter obtaining unit 310 is configured to obtain a value W of a magnetic energy parameter of the transformer.

The leakage inductance parameter calculating unit 320 is configured to calculate a value L of a leakage inductance parameter of the transformer based on the value W of the magnetic energy parameter, and a calculating formula is:

$$L = \frac{2 \times W}{I_g^2},$$

where $I_g$ is the magnitude of the first current density.

The leakage reactance parameter calculating unit 330 is configured to calculate a value $X_L$ of a leakage reactance parameter of the transformer based on the value L of the leakage inductance parameter, and a calculating formula is:

$$X_L = 2 \times \pi \times f \times L$$

where $\pi$ is 3.14, and f is 50 Hz.

In the system for obtaining the relation between the winding state and the leakage reactance parameter of the transformer according to the embodiment of the present disclosure, the relation between the winding state and the leakage reactance parameter of the transformer is obtained by using simulation software, therefore, usage cost is low, and a problem of a great waste in the conventional art caused by using physical transformers to obtain the relation between the winding state and the leakage reactance parameter of the transformer is solved.

The embodiments of the specification are described in a progressive manner, with the emphasis of each of the embodiments on the difference from the other embodiments; hence, for the same or similar parts between the embodiments, one embodiment can refer with to the other embodiments. For the device disclosed in the embodiments, the description thereof is simple because the device corresponds to the methods disclosed in the embodiments. The relevant parts may refer to the description of the method parts.

The description of the embodiments herein enables those skilled in the art to implement or use the present disclosure. Numerous modifications to the embodiments are apparent to those skilled in the art, and the general principles defined herein can be implemented in other embodiments without deviating from the spirit or scope of the present disclosure. Therefore, the present disclosure may not be limited to the embodiments described herein, but is in accordance with the widest scope consistent with the principles and novel features disclosed herein.

The invention claimed is:

1. A method for determining a winding state of a transformer, comprising:

establishing, with a processor operably coupled to a memory configured to store program instructions which are executable by the processor, a simulation transformer based on a size of a first physical transformer, wherein each of components of the simulation transformer simulates a corresponding component of the physical transformer in shapes and sizes;

obtaining operation parameters of the first physical transformer;

setting, using the processor, parameters of the simulation transformer based on the operation parameters of the physical transformer;

wherein the setting parameters of the simulation transformer comprises:

setting a critical condition of the simulation oil tank of the simulation transformer by setting magnetic vectors in Z direction with respect to six faces of the simulation oil tank of the simulation transformer to be zero; and setting a parameter of the simulation oil of the simulation transformer;

setting a winding of the simulation transformer in a predetermined winding state;

obtaining, using the processor, a predetermined number of values of a leakage reactance parameter of the simulation transformer that is in the predetermined winding state;

performing, using the processor, statistics on all the predetermined number of values of the leakage reactance parameter of the simulation transformer that is in the predetermined winding state, to obtain a value range of the leakage reactance parameter of the simulation transformer;

setting the value range of the leakage reactance parameter of the simulation transformer as a value range of a leakage reactance parameter of the first physical transformer;

measuring the leakage reactance parameter of the physical transformer;

comparing the leakage reactance parameter of the physical transformer, with the value range of the leakage reactance parameter of the physical transformer, to obtain a comparison result;

determining the winding state of the physical transformer based on the comparison result;

determining a fault type of the winding of the physical transformer, based on the winding state of the physical transformer, and maintaining the physical transformer based on the fault type.

2. The method according to claim 1, wherein establishing the simulation transformer based on the physical transformer comprises:

establishing an iron core of the simulation transformer by setting center point coordinates of the iron core of the simulation transformer;

establishing a high voltage winding of the simulation transformer by setting a first kind of center point coordinates, a diameter and a cross-sectional shape for each of high voltage single-turn coils of the high voltage winding of the simulation transformer; and establishing a low voltage winding of the simulation transformer by setting a second kind of center point coordinates, a diameter and a cross-sectional shape for each of low voltage single-turn coils of the low voltage winding of the simulation transformer.

3. The method according to claim 2, wherein setting the parameters of the simulation transformer comprises:
setting a magnetization curve of the iron core of the simulation transformer;
setting a magnitude and a direction of a first current density of the high voltage winding of the simulation transformer; and
setting a magnitude and a direction of a second current density of the low voltage winding of the simulation transformer, wherein the direction of the second current density is opposite to the direction of the first current density.

4. The method according to claim 3, wherein:
setting the magnitude and the direction of the first current density of the high voltage winding of the simulation transformer comprises:
setting the magnitude of the first current density of the high voltage winding of the simulation transformer based on a current magnitude of a high voltage winding indicated by a nameplate of the physical transformer; and
setting the direction of the first current density of the high voltage winding of the simulation transformer to be a counterclockwise direction; and
setting the magnitude and the direction of the second current density of the low voltage winding of the simulation transformer comprises:
setting the magnitude of the second current density of the high voltage winding of the simulation transformer based on the magnitude of the first current density, and a ratio of the number of high voltage windings to the number of low voltage windings indicated by the nameplate of the physical transformer; and
setting the direction of the second current density of the high voltage winding of the simulation transformer to be a clockwise direction.

5. The method according to claim 2, wherein setting the winding of the simulation transformer in the predetermined winding state comprises:
setting y-coordinates of all the first kind of center point coordinates to be the same, setting y-coordinates of all the second kind of center point coordinates to be the same, setting x-coordinates of all the first kind of center point coordinates, x-coordinates of all the second kind of center point coordinates and x-coordinate of the center point coordinates of the iron core of the simulation transformer to be the same, setting the center point coordinates of the iron core of the simulation transformer to remain unchanged, setting the diameters and the cross-sectional shapes of all the high voltage single-turn coils to be the same, and setting the diameters and the cross-sectional shapes of all the low voltage single-turn coils to be the same, to place the windings of the simulation transformer in a normal state;
keeping the windings of the simulation transformer in the normal state to:
change the y-coordinates of all or a part of the first kind of center point coordinates and/or the second kind of center point coordinates, to place the windings of the simulation transformer in a longitudinal movement fault state;
change the x-coordinate of the center point coordinates of the iron core of the simulation transformer or change the x-coordinates of all or a part of the first kind of center point coordinates and/or the second kind of center point coordinates, to place the windings of the simulation transformer in an axial movement fault state;
change constantly the x-coordinate and/or the y-coordinate of the center point coordinates of the iron core of the simulation transformer, to place the windings of the simulation transformer in a fault state in which the iron core of the windings looses;
increase the diameters of all or a part of the high voltage single-turn coils and/or the low voltage single-turn coils, to place the windings of the simulation transformer in a fault state in which the windings bulge; and
bend cross sections of all or a part of the high voltage single-turn coils and/or the low voltage single-turn coils, to place the windings of the simulation transformer in a fault state in which the windings warp.

6. The method according to claim 1, wherein obtaining the predetermined number of values of the leakage reactance parameter of the simulation transformer that is in the predetermined winding state comprises:
obtaining a value W of a magnetic energy parameter of the simulation transformer;
calculating a value L of a leakage inductance parameter of the simulation transformer based on the value W of the magnetic energy parameter; and
calculating a value XL of the leakage reactance parameter of the simulation transformer based on the value L of the leakage inductance parameter;
wherein a calculating formula for calculating the value L of the leakage inductance parameter of the simulation transformer based on the value W of the magnetic energy parameter is:

$$L = \frac{2 \times W}{I_g^2},$$

wherein Ig is a magnitude of a first current density; and
wherein a calculating formula for calculating the value XL of the leakage reactance parameter of the simulation transformer based on the value L of the leakage inductance parameter is:

$$X_L = 2 \times \pi \times f \times L,$$

wherein $\pi$ is 3.14, and f is 50 Hz.

7. The new method according to claim 1, further comprimising:
reporting by using the processor, the fault type of the winding of the physical transformer to a field staff for detecting the physical transformer.

8. The method according to claim 1,
wherein the components of the simulation transformer comprises a simulation oil tank and simulation oil, the corresponding component for the simulation oil tank is an oil tank of the physical transformer, the corresponding component for the simulation oil is an oil of the physical transformer, and the oil tank is filled with the oil; and
wherein magnetic vectors of six faces of the simulation oil tank are set to be zero in a z-coordinate direction.

9. A system for determining a winding state of a transformer, comprising:
one or more processors;
a memory storing program instructions, that when executed by the one or more processors, configure the system to perform the following operations:

establishing a simulation transformer based on a size of a physical transformer, wherein each of components of the simulation transformer simulates a corresponding component of the physical transformer in shapes and size;

obtaining operation parameters of the physical transformer;

setting parameters of the simulation transformer based on the operation parameters of the physical transformer;

wherein setting parameters of the simulation transformer comprises:

setting a critical condition of the simulation oil tank of the simulation transformer by setting magnetic vectors in Z direction with respect to six faces of the simulation oil tank of the simulation transformer to be zero; and setting a parameter of the simulation oil of the simulation transformer;

setting a winding of the simulation transformer in a predetermined state;

obtaining a predetermined number of values of a leakage reactance parameter of the simulation transformer that is in the predetermined winding state; and performing statistics on all the predetermined number of values of the leakage reactance parameter of the simulation transformer that is in the predetermined winding state, to obtain a value range of the leakage reactance parameter of the simulation transformer;

setting the value range of the leakage reactance parameter of the simulation transformer as a value range of a leakage reactance parameter of the first physical transformer;

measuring the leakage reactance parameter of the physical transformer;

comparing the leakage reactance parameter of the physical transformer, with the value range of the leakage reactance parameter of the physical transformer, to obtain a comparison reult;

determining the winding state of the physical transformer based on the comparison result;

determining a fault type of the winding of the physical transformer, based on the winding state of the physical transformer; and maintaining the physical transformer based on the fault type.

10. The system according to claim 9, wherein establishing the simulation transformer based on the physical transformer comprises:

establishing an iron core of the simulation transformer by setting center point coordinates of the iron core of the simulation transformer;

establishing a high voltage winding of the simulation transformer by setting a first kind of center point coordinates, a diameter and a cross-sectional shape for each of high voltage single-turn coils of the high voltage winding of the simulation transformer; and establishing a low voltage winding of the simulation transformer by setting a second kind of center point coordinates, a diameter and a cross-sectional shape for each of low voltage single-turn coils of the low voltage winding of the simulation transformer.

11. The system according to claim 9, wherein setting the parameters of the simulation transformer comprises:

setting a magnetization curve of the iron core of the simulation transformer;

setting a magnitude and a direction of a first current density of the high voltage winding of the simulation transformer; and setting a magnitude and a direction of a second current density of the low voltage winding of the simulation transformer, wherein the direction of the second current density is opposite to the direction of the first current density.

12. The system according to claim 9, wherein obtaining the predetermined number of values of the leakage reactance parameter of the simulation transformer that is in the predetermined winding state comprises:

obtaining a value W of a magnetic energy parameter of the transformer;

calculating a value L of a leakage inductance parameter of the transformer based on the value W of the magnetic energy parameter, where a calculating formula is:

$$L = \frac{2 \times W}{I_g^2},$$

wherein Ig is a magnitude of a first current density; and calculating a value XL of the leakage reactance parameter of the transformer based on the value L of the leakage inductance parameter, wherein a calculating formula is:

$$X_L = 2 \times \pi \times f \times L,$$

wherein $\pi$ is 3.14, and f is 50 Hz.

13. The system according to claim 9, wherein the instructions further configure the system to perform:

reporting the fault type of the winding of the physical transformer to a field staff for detecting the physical transformer.

14. The system according to claim 9, wherein the components of the simulation transformer comprises a simulation oil tank and simulation oil, the corresponding component for the simulation oil tank is an oil tank of the physical transformer, the corresponding component for the simulation oil is an oil of the physical transformer, and the oil tank is filled with the oil; and wherein magnetic vectors of six faces of the simulation oil tank are set to be zero in a z-coordinate direction.

* * * * *

UNITED STATES PATENT AND TRADEMARK OFFICE
CERTIFICATE OF CORRECTION

PATENT NO. : 10,546,074 B2
APPLICATION NO. : 14/901759
DATED : January 28, 2020
INVENTOR(S) : Wenlin He et al.

Page 1 of 1

It is certified that error appears in the above-identified patent and that said Letters Patent is hereby corrected as shown below:

On the Title Page

Item (30), under Foreign Application Priority Data, please amend the foreign priority reference number to read "201410654094.4".

In the Claims

In Column 22, Line 47, delete the word "new".

In Column 22, Lines 47 and 48, please amend the word "comprimising" to read "comprising".

In Column 23, Line 38, please amend the word "reult" to read "result".

Signed and Sealed this
Twenty-first Day of July, 2020

Andrei Iancu
*Director of the United States Patent and Trademark Office*